(12) United States Patent
Defauw et al.

(10) Patent No.: US 11,596,075 B2
(45) Date of Patent: Feb. 28, 2023

(54) INVERTER ASSEMBLY

(71) Applicant: NISSAN NORTH AMERICA, INC., Franklin, TN (US)

(72) Inventors: Roy Defauw, Fenton, MI (US); Ronald Morrow, Novi, MI (US); Dale Butterworth, Brighton, MI (US)

(73) Assignee: NISSAN NORTH AMERICA, INC., Franklin, TN (US)

( * ) Notice: Subject to any disclaimer, the term of this patent is extended or adjusted under 35 U.S.C. 154(b) by 274 days.

(21) Appl. No.: 15/930,092

(22) Filed: May 12, 2020

(65) Prior Publication Data

US 2021/0360808 A1    Nov. 18, 2021

(51) Int. Cl.
| | |
|---|---|
| *H05K 5/03* | (2006.01) |
| *B60K 1/00* | (2006.01) |
| *B60R 16/03* | (2006.01) |
| *B60L 15/00* | (2006.01) |
| *H02M 7/44* | (2006.01) |
| *H05K 7/20* | (2006.01) |
| *H02M 7/00* | (2006.01) |
| *B60L 1/00* | (2006.01) |
| *B60K 1/04* | (2019.01) |

(52) U.S. Cl.
CPC .............. *H05K 5/03* (2013.01); *B60K 1/00* (2013.01); *B60L 1/006* (2013.01); *B60L 15/007* (2013.01); *B60R 16/03* (2013.01); *H02M 7/003* (2013.01); *H02M 7/44* (2013.01); *H05K 7/2089* (2013.01); *B60K 2001/0405* (2013.01); *B60L 2210/40* (2013.01); *B60Y 2410/10* (2013.01)

(58) Field of Classification Search
CPC .. B60L 2210/40; B60L 1/006; B60Y 2410/10; B60R 16/03; B60R 16/033; H02M 7/003; B60K 2001/0422; B60K 2001/0433
See application file for complete search history.

(56) References Cited

U.S. PATENT DOCUMENTS

| | | | |
|---|---|---|---|
| 6,902,020 | B2 | 6/2005 | Kronner et al. |
| 7,079,379 | B2 | 7/2006 | Yamaguchi et al. |
| 10,160,286 | B2 | 12/2018 | Mori et al. |
| 2015/0121767 | A1 | 5/2015 | Nagamori et al. |
| 2015/0342087 | A1 | 11/2015 | Donth et al. |
| 2018/0056894 | A1* | 3/2018 | Tsumura ................. B60R 13/07 |

FOREIGN PATENT DOCUMENTS

JP         2004027098 A  *  1/2004

OTHER PUBLICATIONS

Author unknown, "rear under seat storage?", 2016, F150Forum.com, retrieved from www.f150forum.com/f118/rear-under-seat-storage-355784/ on Apr. 7, 2022 (Year: 2016).*

(Continued)

*Primary Examiner* — Ryan Johnson
(74) *Attorney, Agent, or Firm* — Global IP Counselors, LLP (57) ABSTRACT

A vehicle includes a vehicle body, a vehicle seat, an inverter and an inverter cover. The vehicle body defines a vehicle interior. The vehicle seat is disposed on a floor of the vehicle interior. The inverter has a housing fixed to the floor of the vehicle interior at a location underneath the vehicle seat. The inverter cover is detachably attached to the inverter housing.

17 Claims, 8 Drawing Sheets

(56) References Cited

OTHER PUBLICATIONS

Author unknown, "2015-2020 Ford F150 OEM 110v AC DC Power Inverter Unit FL3T-19G317-BF3", 2022, ebay.com, retrieved from retrieved from www.ebay.com/itm/255358768911 on Apr. 7, 2022 (Year: 2022).*

Ebay2, "2015-2020 Ford F150 Power Supply Electronic DC Converter 12 Volt to 110 Volt", retrieved from https://www.ebay.com/itm/304274452289 on Jul. 19, 2022 (Year: 2022).*

North Park Lincoln, "Converter Assembly—Voltage Power Inverter", retrieved from https://parts.nplincoln.eom/p/Ford_2016_F-150/CONVERTER-ASSEMBLY--VOLTAGE-Power-Inverter/75155636/JL3Z19G317BB.html on Jul. 19, 2022 (Year: 2022).*

* cited by examiner

INVERTER ASSEMBLY

BACKGROUND

Field of the Invention

The present invention generally relates to inverter assembly. More specifically, the present invention relates to inverter assembly to be disposed in a vehicle interior.

Background Information

Vehicles can be provided with an inverter that converts DC (direct current) electric power into AC (alternating current) electric power in order to charge a wide range of appliances and electronic gadgets, such as mobile devices and laptops, etc. The inverter can be plugged to an accessory socket (e.g., a fuse panel, a cigarette lighter, or a 12 v accessory socket, etc.) of the vehicle in order to receive power from the vehicle battery (not shown). The inverter 18 can alternatively be connected directly to the battery.

SUMMARY

In view of the state of the known technology, one aspect of the present disclosure is to provide a vehicle comprising a vehicle body, a vehicle seat, an inverter and an inverter cover. The vehicle body defines a vehicle interior. The vehicle seat is disposed on a floor of the vehicle interior. The inverter has a housing fixed to the floor of the vehicle interior at a location underneath the vehicle seat. The inverter cover is detachably attached to the inverter housing.

In view of the state of the known technology, another aspect of the present disclosure is to provide an inverter assembly for a vehicle comprising an inverter and an inverter cover. The inverter has a housing configured to be fixed to the floor of a vehicle interior at a location underneath a vehicle seat. The inverter cover is detachably attached to the inverter housing. The inverter cover is defined by a top wall, a front wall, a rear wall, and a pair of peripheral side walls that connect the front and rear walls. The front, rear and side walls together define an opening of the inverter cover for receiving the inverter therethough into an storage compartment of the inverter cover.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
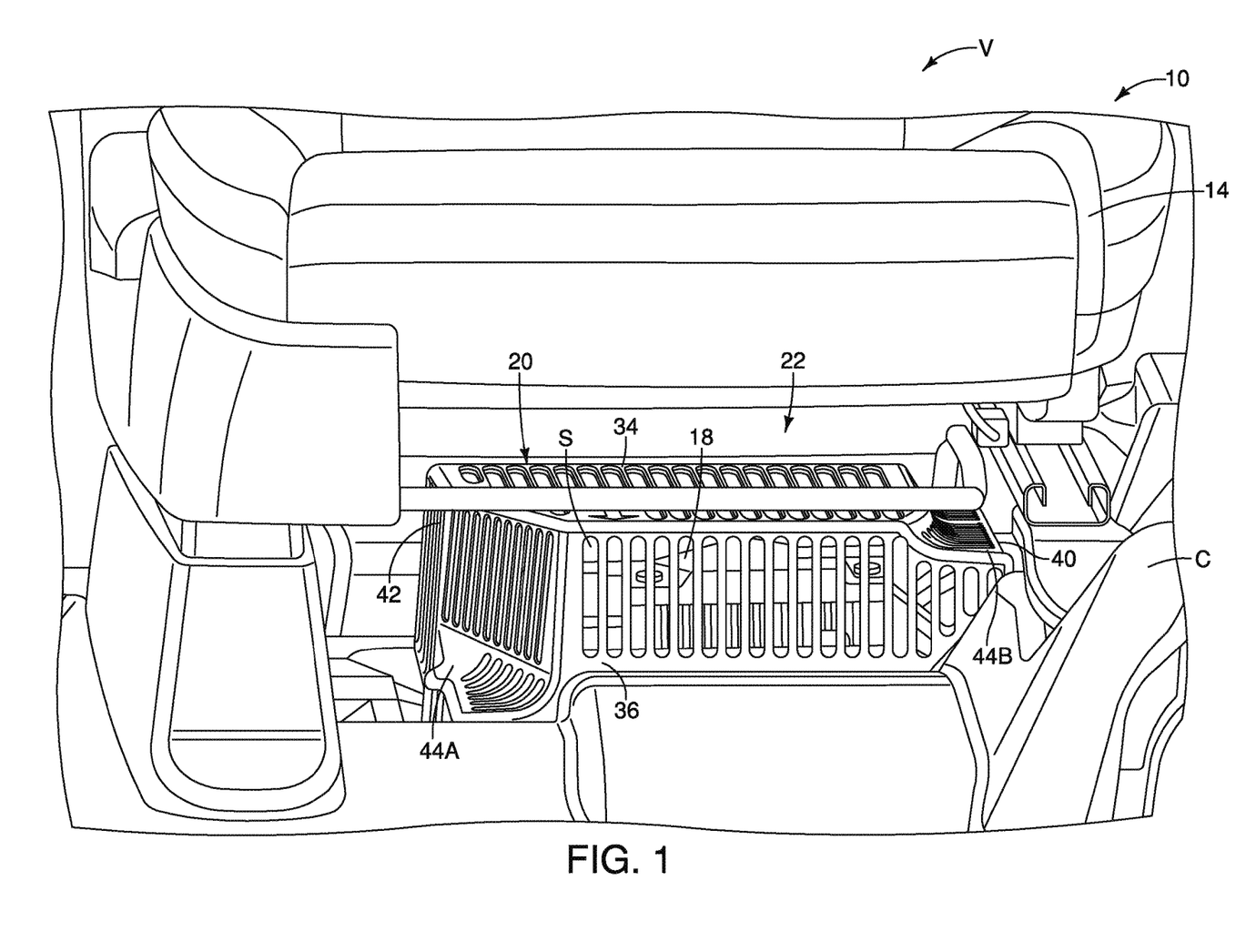
FIG. 1 is view of a portion of a vehicle interior having an inverter assembly as viewed from a vehicle forward direction.

Referring initially to FIG. 1, a portion of a vehicle interior 10 is illustrated in accordance with an illustrated embodiment. The vehicle interior 10 is part of a vehicle V having a vehicle body 12 that defines the vehicle interior 10. In particular, the vehicle interior 10 is a passenger compartment having one or more passenger seats 14. Thus, the vehicle further includes a vehicle seat 14 that is disposed on a floor 16 of the vehicle interior 10. In the illustrated embodiment, the vehicle V further includes an inverter 18 for powering or charging electrical appliances and accessories that can be used by the passenger while in the vehicle interior 10.

In the illustrated embodiment as seen in FIG. 1, the inverter 18 is configured to be disposed underneath the vehicle seat 14 of the vehicle V. The vehicle seat 14 is illustrated as being a front passenger seat 14 of the vehicle V. However, it will be apparent to those skilled in the vehicle field from this disclosure that the inverter 18 can be disposed underneath any of the other vehicle seats of the vehicle V, such as the driver's seat. In the illustrated embodiment, the vehicle further includes an inverter cover 20. The inverter 18 and the inverter cover 20 are together considered an inverter assembly 22 of the illustrated embodiment. In other words, the vehicle V further includes the inverter assembly 22. The inverter cover 20 is disposed over the inverter 18 at a location underneath the vehicle seat 14, as will be further described below.

The inverter 18 is a power inverter that converts DC (direct current) electric power into AC (alternating current) electric power in order to charge a wide range of appliances and electronic gadgets, such as mobile devices and laptops, etc. In the illustrated embodiment, the inverter 18 is preferably connected directly to a vehicle battery (not shown) to receive power from the vehicle battery. However, it will be apparent to those skilled in the vehicle field from this disclosure that the inverter cover 20 can be provided with an he inverter that is plugged to an accessory socket (e.g., a fuse panel, a cigarette lighter, or a 12 v accessory socket, etc.) of the vehicle V in order to receive power from the vehicle battery.

Figure 2:
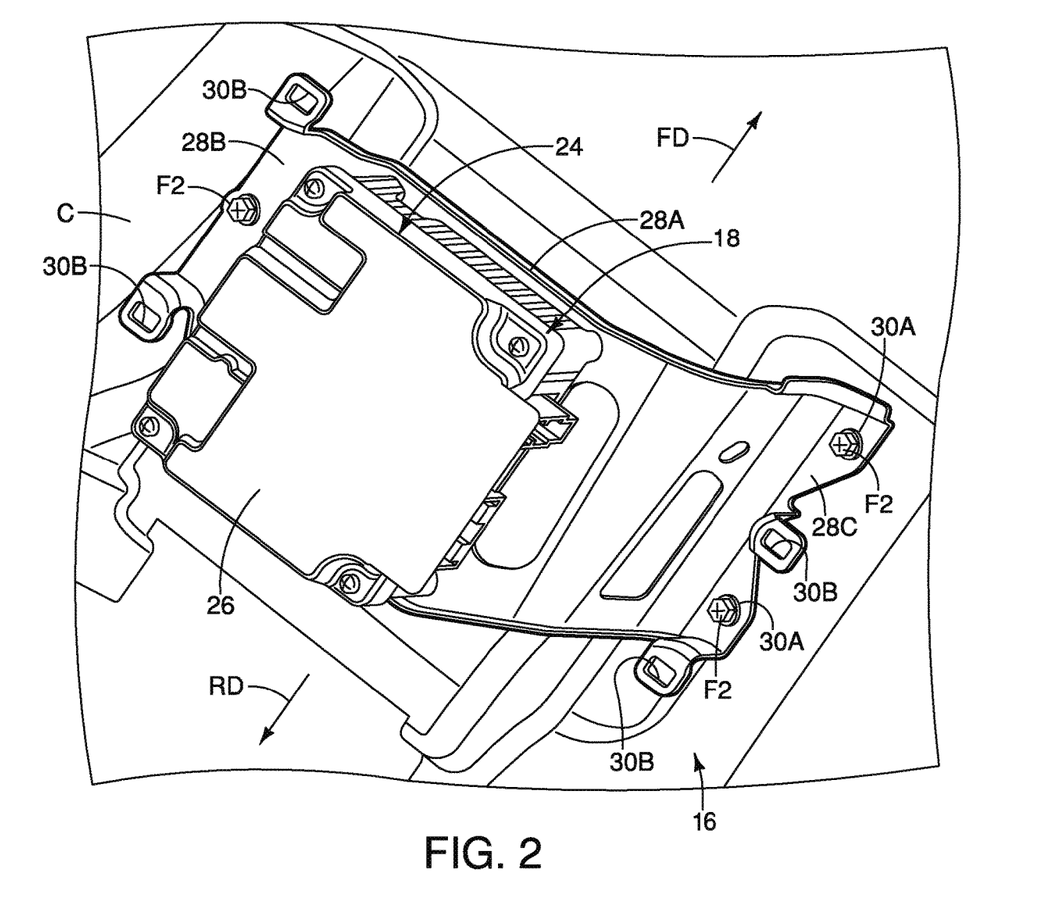
FIG. 2 is a top plan view of an inverter of the inverter assembly that is attached to the vehicle's floor.
Figure 3:
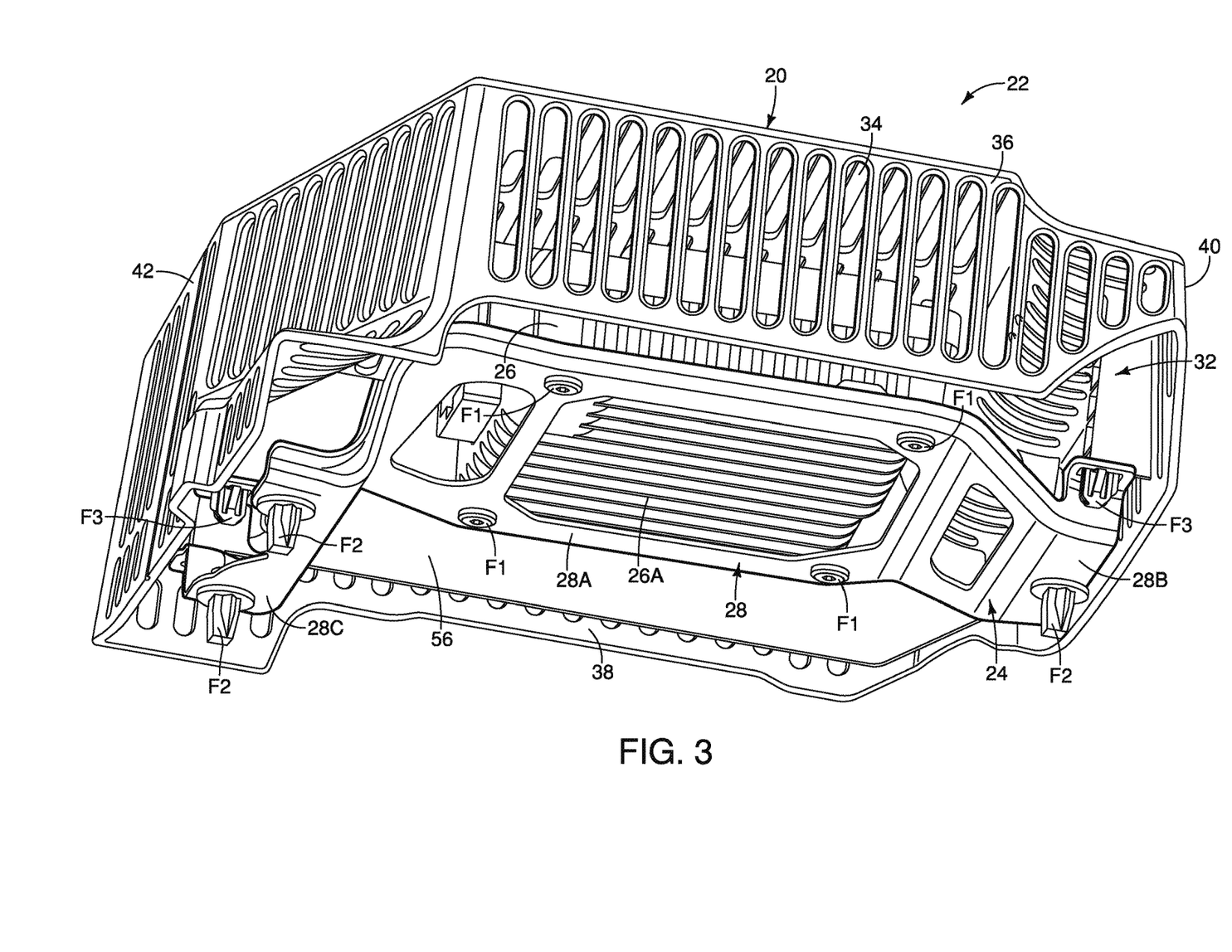
FIG. 3 is a bottom perspective view of the inverter assembly showing the inverter and an inverter cover disposed thereon.

As best seen in FIGS. 2 and 3, the inverter 18 includes a housing 24 that houses the electronic components of the inverter 18. The housing 24 is fixed to the floor 16 of the vehicle interior 10 at a location underneath the vehicle seat 14, as shown in FIG. 2. The housing 24 is a metal fixture having a casing 26 for housing the inverter's 18 electronic components and a bracket 28. The casing 26 is a rigid storage compartment that is sized and dimensioned for containing the electronic components of the inverter 18. In the illustrated embodiment, the casing 26 is illustrated as a substantially square-shaped containment structure. The casing 26 preferably includes cooling fins 26A disposed on one or more exterior surfaces of the casing 26 for dissipating heat generated by the electronic components.

The bracket 28 is attached to the casing 26 and mounts the casing 26 to the floor 16 of the vehicle V. The bracket 28 is preferably made of a rigid structure such as metal. As best seen in FIGS. 2 and 3, the bracket 28 includes a supporting section 28A and a pair of first and second extending sections 28B and 28C that extend from opposite sides of the supporting section 28A. The bracket 28 is detachably attached to the casing 26 at the supporting section 28A by fasteners F1 such as screws. Alternatively, it will be apparent to those skilled in the vehicle field from this disclosure that the casing 26 can be constructed as having a bracket that is integrally formed thereon for mounting the housing 24 to the vehicle floor 16.

The first and second extending sections 28B and 28C extend from opposite lateral sides of the of the supporting section 28A. Specifically, as best seen in FIG. 2, the first extending section 28B extends from the from the supporting section 28A in a direction towards a vehicle console C. The second extending section 28C extends from the supporting section 28A towards a vehicle door (not shown). While the supporting section 28A and the extending sections 28B and 28C are shown as a one-piece member, it will be apparent to those skilled in the vehicle field from this disclosure that the supporting section 28A and the extending sections 28B and 28C can be formed as separate sections that are fixed together by fasteners. It will also be apparent to those skilled in the vehicle field from this disclosure that the bracket 28 can have many types of dimensions and shapes as needed and/or desired.

As shown, the inverter 18 is mounted to the vehicle floor 16 via the bracket 28. In particular, the inverter 18 is mounted to a floor panel (e.g., the floor 16) of the vehicle body 12 that is covered by carpet. The carpet can be folded back to mount the bracket 28 to the floor panel 16. As best seen in FIG. 2, the bracket 28 can be secured to the floor panel 16 by fasteners F2, such as grommets, bolts and/or screws. Referring to FIGS. 2 and 3, the bracket 28 includes a plurality of first receiving openings 30A for receiving the fasteners F2 that mount the bracket 28 to the floor panel 16. The bracket 28 further includes a plurality of second receiving openings 30B for receiving fasteners securing the inverter cover 20 to the bracket 28, as will be further discussed. In particular, the first extending section 28B includes a pair of the second receiving openings 30B and the second extending section 28C includes another pair of the second receiving openings 30B. It will be apparent to those skilled in the vehicle field from this disclosure that the housing 24 of the inverter 18 can include receiving openings 30A and 30B at a variety of locations in order to mount the housing 24 to the vehicle floor 16, and to mount the inverter cover 20 to the housing 24.

Due to the location of the inverter 18 being located within the interior 10 of the vehicle, the inverter 18 is at a location that can come into contact with a passenger. As the inverter 18 includes electronics and the housing 24 is made of metal, the housing 24 can become hot during use of the inverter 18. Therefore, the inverter cover 20 is provided with the vehicle V for being disposed over the inverter 18. In particular, the inverter cover 20 serves as a heat dissipating barrier that separates the inverter housing 24 from a passenger to prevent the passenger from inadvertently contacting the inverter 18. Conventional inverters and inverter assemblies are provided with a cooling fan for dissipating heat. Typically, cooling fans are known to have durability concerns and make unwanted noise during use. However, due to the inverter cover 20 dissipating heat generated by the inverter 18, the inverter 18 of the illustrated embodiment does not include a cooling fan. As a result, the inverter assembly 22 of the illustrated embodiment produces less noise and has increased longevity and durability.

Figure 4:
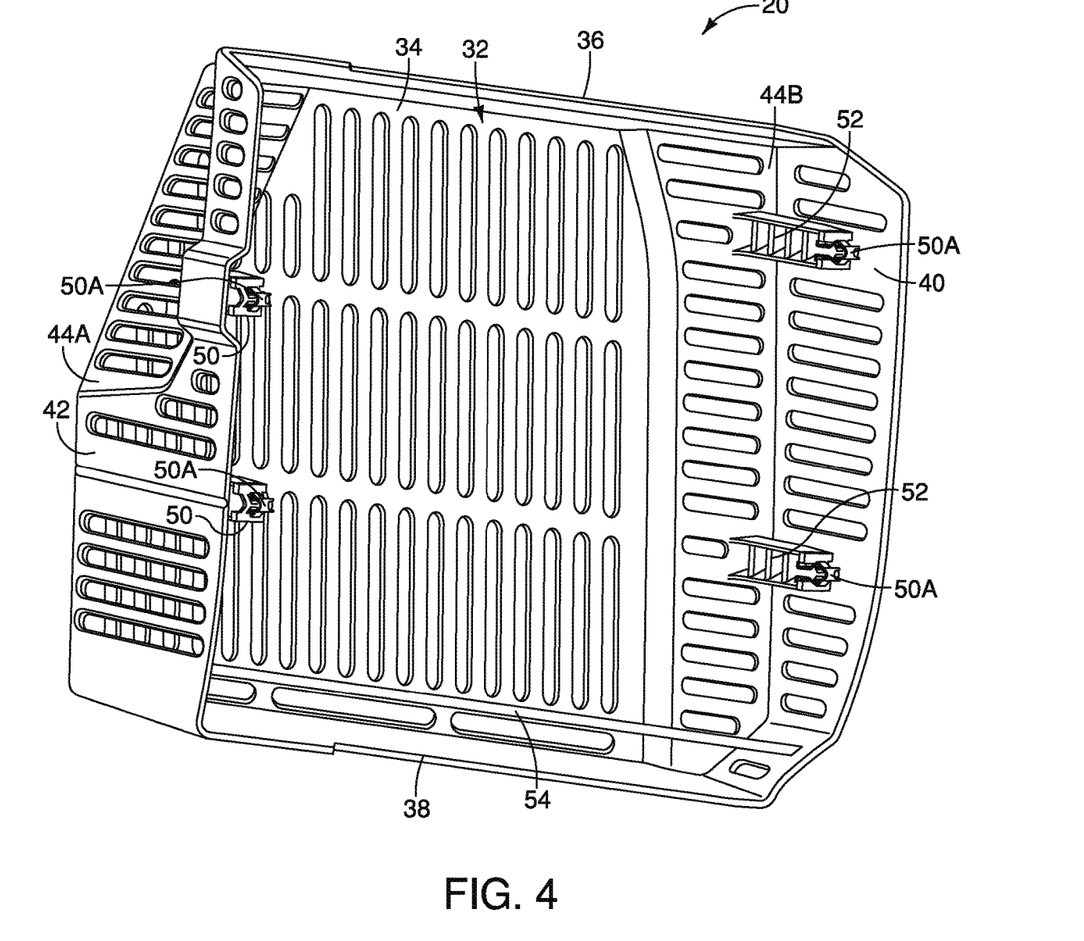
FIG. 4 is a perspective view of an interior of the inverter cover.
Figure 5:
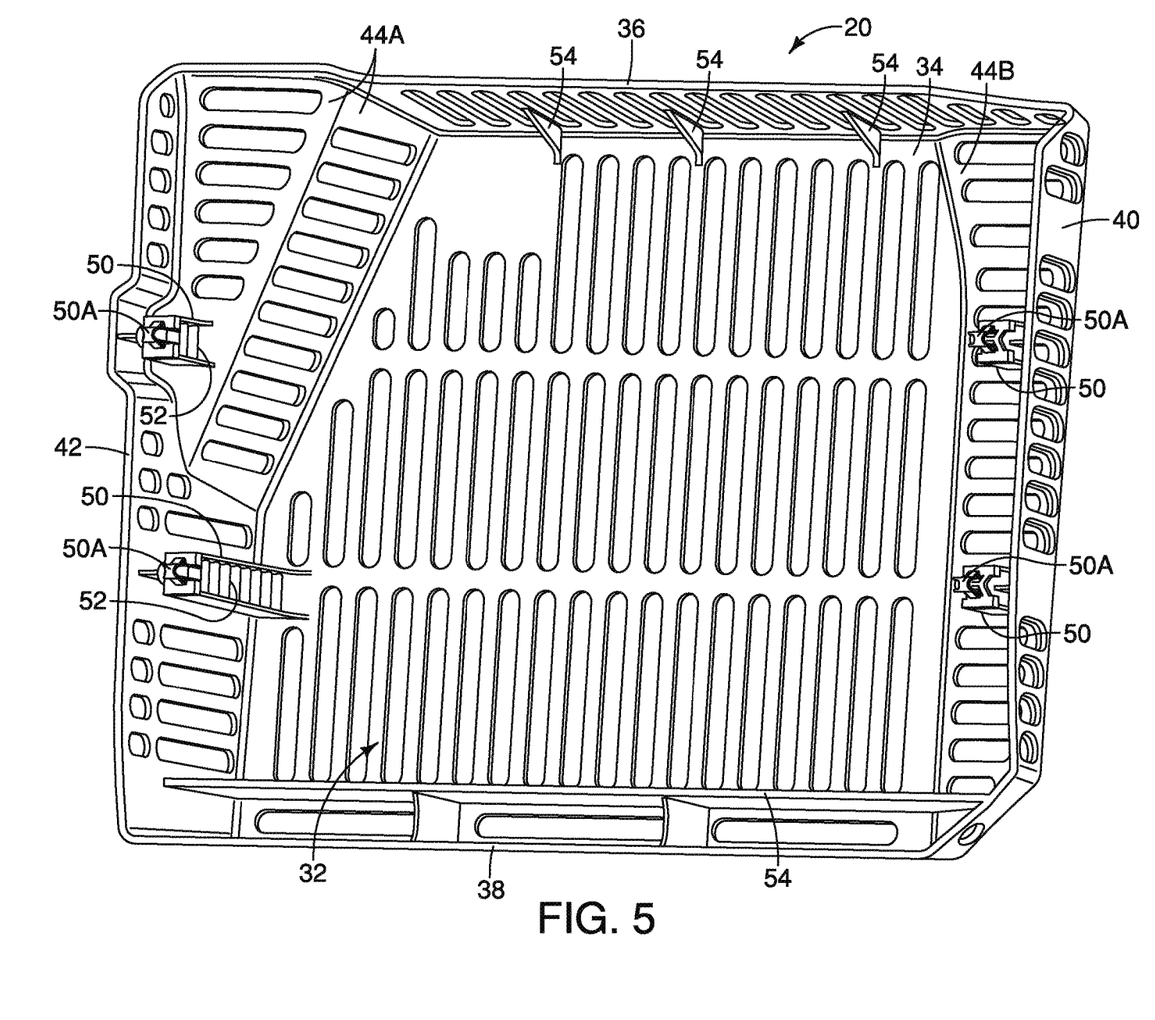
FIG. 5 is a plan view of the interior of the inverter cover.

Referring to FIGS. 2 to 5, the inverter cover 20 is detachably attached to the inverter 18. In particular, the inverter cover 20 is detachably attached to the bracket 28 of the inverter housing 24, as will be further discussed below. Referring to FIGS. 4 and 5, the inverter cover 20 is formed as a top having lateral sides that together define an opening 32 for receiving the inverter 18. In particular, the inverter cover 20 is defined by a top wall 34, a front wall 36, a rear wall 38 and a pair of peripheral side walls 40 and 42. The front, rear and side walls 40 and 42 together define the opening 32 of the inverter cover 20 for receiving the inverter 18 therethough. The inverter 18 sits in an interior space S that serves as a storage compartment of the inverter cover 20.

As best seen in FIG. 3, the inverter cover 20 is fixed to the housing 24 so that the inverter 18 is disposed in the interior space S of the inverter cover 20. Also as shown in FIG. 1, the inverter cover 20 is preferably spaced from the housing 24 when the inverter 18 is disposed inside the inverter cover 20 to maintain a distance between the passenger and the inverter housing 24 and to facilitate airflow generated by the inverter 18 to the environment. In the illustrated embodiment, the top, front, rear and side walls 34, 36, 38, 40 and 42 of the inverter cover 20 are formed as a one-piece member. In particular, the top, front, rear and side walls 34, 36, 38, 40 and 42 of the inverter cover 20 are made of a lightweight plastic or thermoplastic polymer such as polypropylene.

Figure 6:
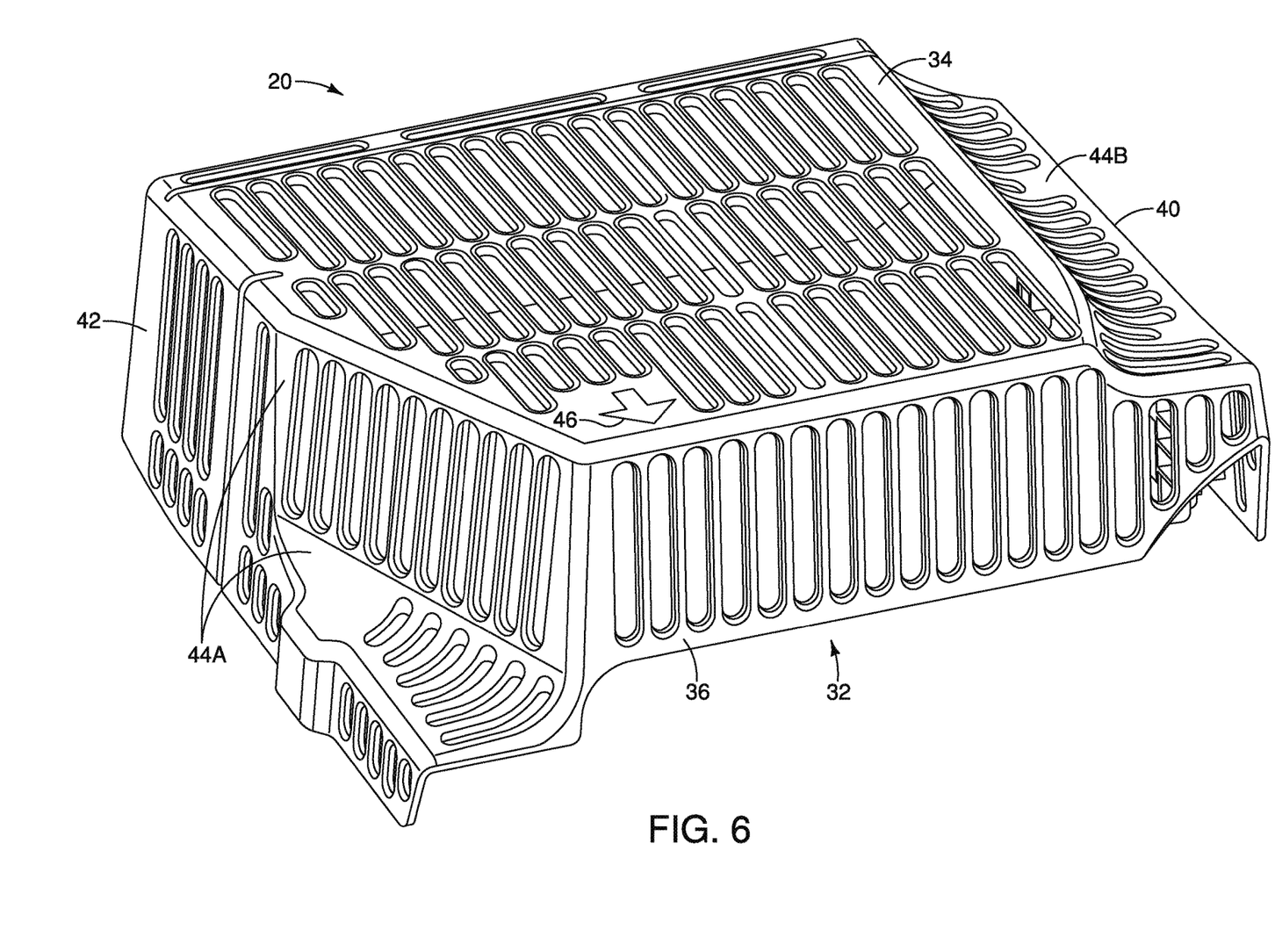
FIG. 6 is a perspective view of an exterior of the inverter cover.
Figure 7:
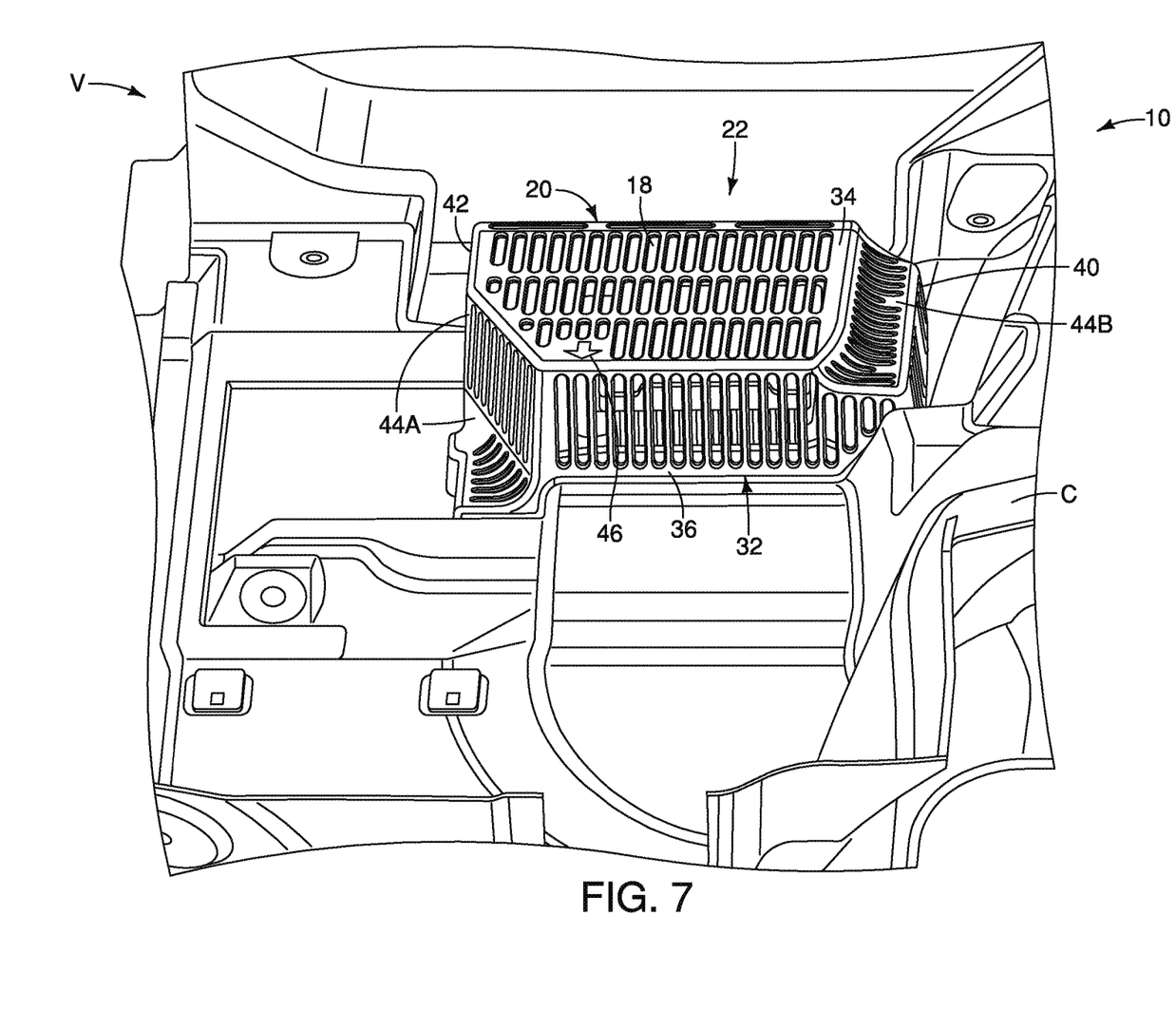
FIG. 7 is a view of the inverter assembly installed on the vehicle floor from the vehicle forward direction.
Figure 8:
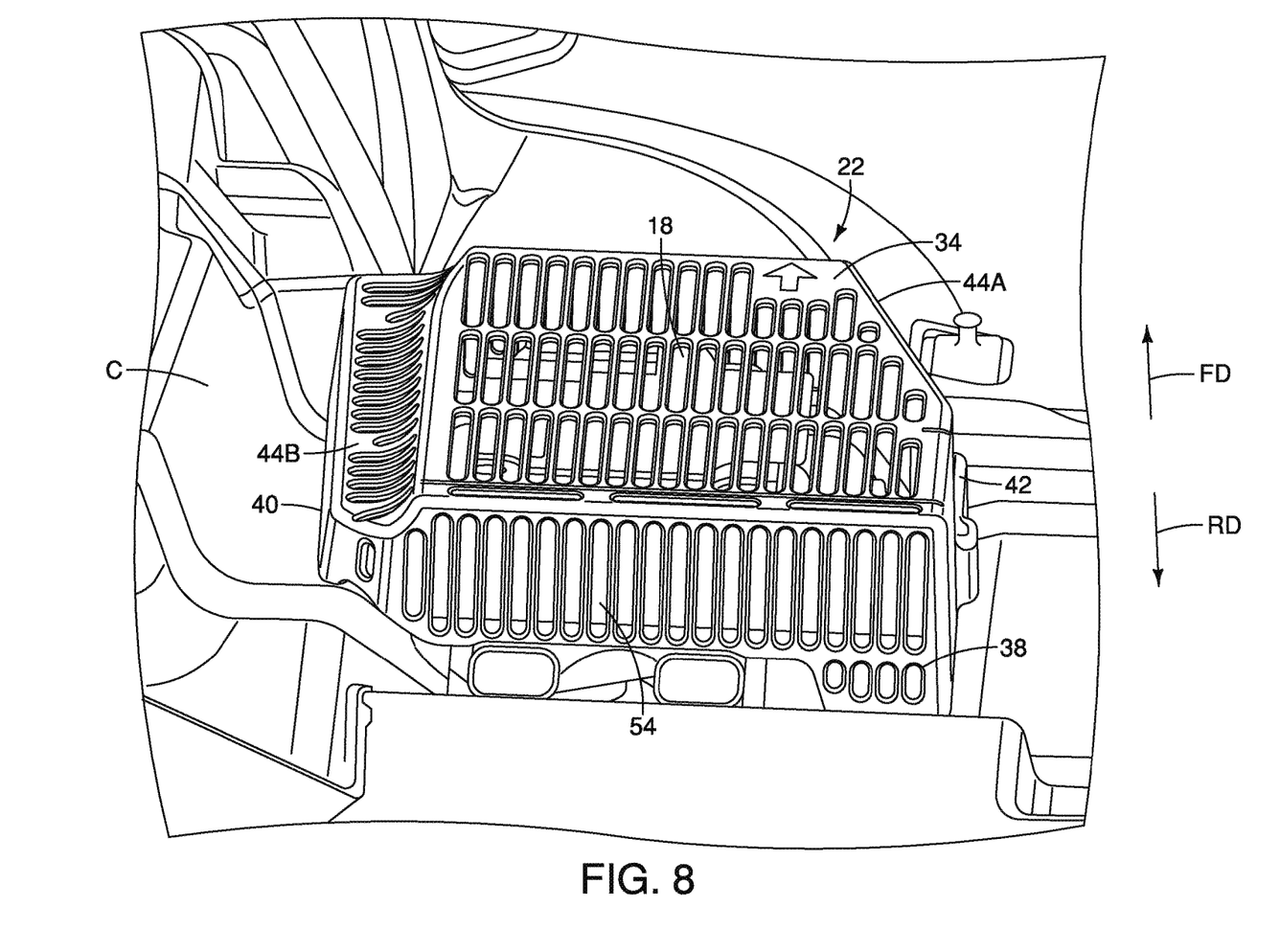
FIG. 8 is a view of the inverter assembly installed on the vehicle floor from a vehicle rearward direction.

As seen in FIGS. 6 to 8, a top of the inverter cover 20 is preferably defined by the top wall 34 and one or more slanted surfaces 44A and 44B that are slanted or angled with respect to the top wall 34. The slanted surfaces 44A and 44B are formed to correspond to the space underneath the vehicle seat 14 and to the area between the vehicle's center console C and the vehicle door. The slanted surfaces 44A and 44B are also provided to accommodate the passenger's foot placement if desired and for accommodating any electrical harnesses or connections of the inverter 18. For simplicity, the slanted surfaces 44A and 44B will be considered part of the side walls 40 and 42 of the inverter cover. It will be apparent to those skilled in the vehicle field from this disclosure that the inverter cover 20 can have different types of slanted surfaces as needed and/or desired so that the inverter 18 can be shaped to correspond to different spaces as required.

In the illustrated embodiment, the inverter 18 is installed to the vehicle floor 16, then the inverter cover 20 is provided over the inverter 18. Afterward, the vehicle seat 14 is installed to the vehicle floor 16 over the inverter cover 20. As seen in FIG. 1, the top wall 34 of the inverter cover 20 faces the vehicle seat 14. As best seen in FIGS. 6 and 7, the inverter cover 20 preferably includes one or more indicators or marks indicating a directional orientation of the inverter cover 20 in the vehicle V. For example, the inverter cover 20 can include an indicator 46 on the top wall 34 such as an arrow that is meant to point in a vehicle forward direction FD (i.e., a direction towards a front of the vehicle) when the inverter cover 20 is installed properly. Preferably, the top wall 34 of the inverter cover 20 remains spaced from the vehicle seat 14 after the vehicle seat 14 is installed. Additionally, the inverter cover 20 is preferably spaced from the base of the carpet after the inverter cover 20 is installed. In this way, heat can better dissipate from the vents 48 of the inverter cover 20 to the environment.

Referring to FIGS. 1, 7 and 8, the front wall 36 of the inverter cover 20 faces the vehicle forward direction FD, and the rear wall 38 faces a vehicle rearward direction RD (i.e., a direction towards a rear of the vehicle). The peripheral side walls 40 and 42 of the inverter cover 20 connect the front and rear walls 36 and 38. A first side wall 40 is a console C-facing side wall that faces the center console C. A second side wall 42 is a door-facing side wall that faces the door. As shown, the walls 34, 36, 38, 40 and 42 of the inverter cover 20 each include vents 48 for dissipating heat generated by the inverter 18. As shown, the vents 48 are elongated openings disposed along the walls 34, 36, 38, 40 and 42 of the inverter cover 20. It will be apparent to those skilled in the vehicle field from this disclosure that the vents 48 can have varying dimensions and sizes.

As best seen in FIGS. 4 and 5, the interior 10 of the inverter cover 20 includes a plurality of attachment structures 50 for connecting the inverter cover 20 to the inverter 18. Each of the attachment structures 50 include a protruding end 50A that is connected to the bracket 28. In the illustrated embodiment, the attachment structures 50 are provided on the side walls 40 and 42. Therefore, the side walls 40 and 42 of the inverter cover 20 include the attachment structures 50 for detachably connecting the inverter cover 20 to the inverter 18. As seen in FIG. 4, the inverter cover 20 includes four attachment structures 50. Each of the side walls 40 and 42 includes a pair of the attachment structures 50. The attachment structures 50 correspond to the locations of the second receiving openings 30B of the bracket 28. That is, the second receiving openings 30B of the bracket 28 receive the attachment structures 50 therethough.

As best seen in FIG. 3, the side walls 40 and 42 are disposed over the bracket 28 of the housing 24 so that the side walls 40 and 42 of the inverter cover 20 is attached to the bracket 28. In other words, the inverter cover 20 is attached to the housing 24 at the side walls 40 and 42 in the illustrated embodiment. However, it will be apparent to those skilled in the vehicle field from this disclosure that the inverter cover 20 can be additionally or alternatively attached to the bracket 28 at either the front or rear walls 36 and 38. In other words, the front or rear walls 36 and 38 can alternatively include attachment structures 50 for connecting to the inverter cover 20 to the housing 24.

In the illustrated embodiment, the attachment structures 50 are extensions having a ladder-like structure extending from the top wall 34 and the side walls 40 and 42. The attachment structures 50 preferably include one or more ribs 52 to enhance the stiffening of the attachment structures 50. The attachment structures 50 are configured to be clipped to the bracket 28 either directly or indirectly via additional fasteners F3, as best seen in FIG. 3. After the inverter housing 24 is mounted to the floor panel 16, the inverter cover 20 is provided over the inverter 18 housing 24. In particular, each one of the ends 50A of the attachment structures 50 are received by one of the second receiving openings 30B of the bracket 28.

In the illustrated embodiment, the inverter cover 20 is detachably clipped to the bracket 28 of the inverter 18 via a plurality of fasteners F3 that are attached to the ends 50A of the attachment structures 50. That is, after the attachment structures 50 are inserted through the second receiving openings 30B, the fasteners F3 are provided on the ends 50A of the attachment structures 50 to secure the inverter cover 20 to the bracket 28, as best seen in FIG. 3. Preferably, the fasteners F3 are metal attachment clips. The clips slide F3 over the ends 50A of the attachment structures 50 and are snapped into place with the bracket 28 therebetween. Therefore, each of the fasteners F3 are secured to one of the attachment structures 50 and are received by a corresponding one of the second openings 32 of the inverter 18.

As seen in FIG. 5, the interior of the inverter cover 20 preferably includes one or more fins 54. The fins 54 are protruding surfaces provided along any of the walls 34, 36, 38, 40 and 42 of the inverter cover 20. For example, the fins 54 are illustrated as being on the front wall 36 of the inverter cover 20 to reduce warpage of the front wall 36. The fins 54 are preferably small to increase the robustness of the fins 54. Also, as best seen in FIG. 5, the interior 10 further includes another fin 56 that is large sized to correspond substantially the dimension of the rear wall 38. The another fin 56 extends adjacent to and is parallel with the rear wall 38 of the inverter cover 20. As the rear wall 38 is likely where the passenger's foot will be placed, the another fin 56 is provided as a barrier and heat dissipating agent near the rear wall 38. Therefore, the another wall 56 is considered a heat dissipation fin that is sized and dimensioned to increase the rate of heat transfer from the inverter cover 20 to the environment. It will be apparent to those skilled in the vehicle field from this disclosure that the inverter cover 20 can include many different types of fins of different shapes and sizes at different locations in order to dissipate heat and/or to increase the robustness of the inverter cover 20.

General Interpretation of Terms

In understanding the scope of the present invention, the term "comprising" and its derivatives, as used herein, are intended to be open ended terms that specify the presence of the stated features, elements, components and/or groups, but do not exclude the presence of other unstated features, elements, components and/or groups. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of a vehicle equipped with the inverter assembly. Accordingly, these terms, as utilized to describe the present invention should be interpreted relative to a vehicle equipped with the inverter assembly.

The term "configured" as used herein to describe a component, section or part of a device includes hardware that is constructed to carry out the desired function.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A vehicle comprising:
a vehicle body defining a vehicle interior;
a vehicle seat disposed on a floor of the vehicle interior;
an inverter having a housing fixed to the floor of the vehicle interior at a location underneath the vehicle seat;
a bracket attached to a bottom of the housing to mount the housing to the floor of the vehicle via the bracket, the bracket being raised with respect to the floor; and
an inverter cover detachably attached to the bracket, the inverter cover having a top wall, a front wall, a rear wall and a pair of side walls connecting the front and rear walls, each of the top wall, the front wall, rear wall and the side walls having at least one vent.

2. The vehicle according to claim 1, wherein
the inverter cover is defined by a top wall facing the vehicle seat, a front wall facing a vehicle forward direction, a rear wall facing a vehicle rearward direction, and a pair of peripheral side walls that connect the front and rear walls,
the front, rear and side walls together define an opening of the inverter cover for receiving the inverter therethough into an storage compartment of the inverter cover.

3. The vehicle according to claim 2, wherein
the top, front, rear and side walls of the inverter cover each include vents.

4. The vehicle according to claim 2, wherein
the inverter cover is detachably attached to the bracket by a plurality of fasteners.

5. The vehicle according to claim 2, wherein
the side walls of the inverter cover include a plurality of attachment structures for detachably connecting the inverter cover to the bracket.

6. The vehicle according to claim 5, further comprising
a plurality of fasteners, each of the fasteners secured to one of the attachment structures and are received by a receiving opening of the bracket.

7. The vehicle according to claim 2, wherein
the top, front, rear and side walls of the inverter cover are formed as a one-piece member.

8. The vehicle according to claim 7, wherein
the top, front, rear and side walls of the inverter cover are made of polypropylene.

9. A vehicle comprising:
a vehicle body defining a vehicle interior;
a vehicle seat disposed on a floor of the vehicle interior;
an inverter having a housing fixed to the floor of the vehicle interior at a location underneath the vehicle seat;
a bracket attached to a bottom of the housing to mount the housing to the floor of the vehicle via the bracket, the bracket being raised with respect to the floor; and
an inverter cover detachably attached to the bracket, the inverter housing being mounted to the floor of the vehicle via a bracket of the inverter housing, the bracket being directly mounted to the floor of the vehicle.

10. The vehicle according to claim 9, wherein
the inverter cover is detachably clipped to the bracket of the inverter by a plurality of fasteners.

11. An inverter assembly for a vehicle comprising:
an inverter having a housing configured to be fixed to the floor of a vehicle interior at a location underneath a vehicle seat;
a bracket attached to a bottom of the housing, the bracket having an opening to expose one or more cooling fins of the inverter; and
an inverter cover detachably attached to the bracket, the inverter cover being defined by a top wall, a front wall, a rear wall, and a pair of peripheral side walls that connect the front and rear walls,
the front, rear and side walls together define an opening of the inverter cover for receiving the inverter therethough into an storage compartment of the inverter cover.

12. The inverter assembly according to claim 11, wherein
the top, front, rear and side walls of the inverter cover each include vents.

13. The inverter assembly according to claim 11, wherein
the inverter cover is detachably attached to the bracketby a plurality of fasteners.

14. The inverter assembly according to claim 11, wherein
the inverter cover is detachably attached to the bracket of the inverter.

15. The inverter assembly according to claim 14, wherein
the inverter cover is detachably clipped to the bracket of the inverter by a plurality of fasteners.

16. The inverter assembly according to claim 11, wherein
the top, front, rear and side walls of the inverter cover are formed as a one-piece member.

17. The inverter assembly according to claim 16, wherein
the top, front, rear and side walls of the inverter cover are made of polypropylene.

* * * * *